United States Patent [19]
Daniele

[11] 3,993,511
[45] Nov. 23, 1976

[54] HIGH TEMPERATURE ELECTRICAL CONTACT FOR PELTIER-INDUCED LIQUID PHASE EPITAXY ON INTERMETALLIC III-V COMPOUNDS OF GALLIUM

[75] Inventor: Joseph John Daniele, Mohegan Lake, N.Y.

[73] Assignee: North American Philips Corporation, New York, N.Y.

[22] Filed: May 30, 1975

[21] Appl. No.: 582,164

[52] U.S. Cl. .............................. 148/172; 148/171; 252/62.3 GA; 204/39; 204/61
[51] Int. Cl.² .................................... H01L 21/208
[58] Field of Search .......................... 148/171, 172; 252/62.3 GA; 204/39, 61

[56] References Cited
UNITED STATES PATENTS
| | | | |
|---|---|---|---|
| 3,411,946 | 11/1968 | Tramposch | 148/171 X |
| 3,879,235 | 4/1975 | Gatos et al. | 148/171 |

Primary Examiner—G. Ozaki
Attorney, Agent, or Firm—Frank R. Trifari; Ronald L. Drumheller

[57] ABSTRACT

For Peltier-induced liquid phase epitaxy on a substrate which is an intermetallic III-V compound of gallium, electrical contact is made to the substrate via a layer of gallium in which aluminum has been dissolved to a concentration of more than 0.5% by weight.

7 Claims, 1 Drawing Figure

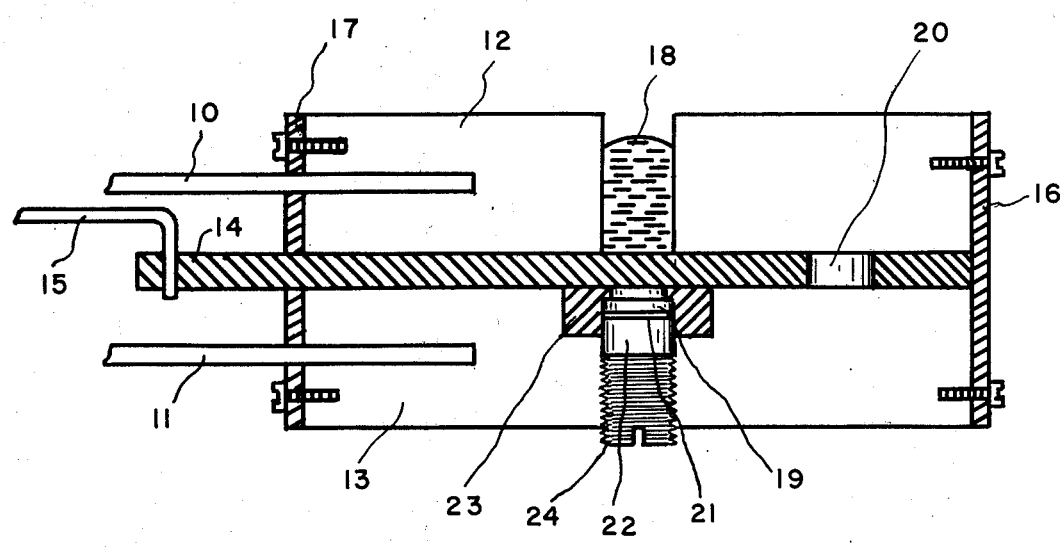

HIGH TEMPERATURE ELECTRICAL CONTACT FOR PELTIER-INDUCED LIQUID PHASE EPITAXY ON INTERMETALLIC III-V COMPOUNDS OF GALLIUM

This invention relates to methods and apparatus for liquid phase epitaxial growth from a solution onto a substrate in a solution-substrate system where local Peltier cooling or heating is employed at the interface between the solution and the substrate. More specifically, the present invention relates to the manner in which electrical contact is made to the substrate particularly in systems for epitaxial growth on intermetallic III-V compounds of gallium.

When an electrical current passes through a solid-liquid interface during liquid phase epitaxial growth, heat is either generated or extracted at the interface (depending upon the direction of the current) due to a phenomenon known as the Peltier effect. The resulting temperature change affects the growth rate at the interface. This Peltier effect has been used to modulate growth rate in order to modulate impurity distribution, and pulses of current have been used to create growth markers which may be revealed through etching.

In an article entitled "Two New Applications of the Peltier Effect", Ioffe, 26 (2) Zhur. Tekh. Fiz. 478 (1956), it was suggested that crystal growth could occur under isothermal conditions of equilibrium between the liquid and solid phases if Peltier cooling were used at the interface and if Joule heating could be neglected. In another article entitled "Some Aspects of Peltier Heating at Liquid-Solid Interfaces in Germanium", Pfann et al., 2 J. Elect. 597 (1957), it was suggested that Joule heating might be prevented from cancelling out Peltier cooling by using a combination of AC and DC current, the proportion of each being changed to produce a Peltier effect but the total Joule heating from which being maintained constant and therefore in isothermal equilibrium. More recently in U.S. Pat. No. 3,879,235, Peltier-induced epitaxial growth is described for an InSb system in an isothermal environment.

It has long been desirable to exert some direct control over liquid phase epitaxial growth of semiconductor materials in order to better control composition and crystal structure. Peltier-induced liquid phase epitaxy is of considerable interest, therefore, because heat is removed from or added directly to the solid-liquid interface and because the rate of heat removal or addition from Peltier effect is proportional to the current and therefore easily controlled in principle. A major problem occurs, however, in getting the Peltier current to or from the substrate, particularly when the substrate is an intermetallic III-V compound of gallium.

Normally, Peltier cooling is desired at the liquid-solid interface in order to induce liquid phase epitaxial growth in a theoretically isothermal environment. At the contact, however, Peltier heating generally occurs and any contact resistance produces Joule heating as well. This heat flows through the substrate toward the liquid-solid interface where it tends to cancel the Peltier cooling and defeat epitaxial growth. Obviously, it is most desirable to reduce the contact resistance and the Peltier heating at the contact as much as possible. The contact structure is further limited by the temperature environment, particularly in the case of intermetallic III-V systems of gallium where normal epitaxy temperatures exceed 800° C and sometimes even exceed 1000° C. Furthermore, the movement of interfaces under Peltier effect is not limited to the desired liquid-solid interface and may well occur also at the contact depending upon the interfaces formed there. Local liquid phases have been observed which rapidly move from the contact through the substrate altering the chemical and crystal structure at the contact as well as in the substrate and at the growth interface. These problems have apparently until now prevented any effective use of the Peltier effect for inducing liquid phase epitaxial growth on intermetallic III-V compounds of gallium.

It is an object of the present invention to make suitable electrical contact to substrates composed of an intermetallic III-V compound of gallium, so that Peltier-induced liquid phase epitaxial growth may be achieved on such substrates.

Another object of this invention is to reduce the contact resistance to such substrates and to reduce Peltier heating at such contacts as much as possible.

It is a further object to make such contacts for use at temperatures of 800° C or more.

Another object is to avoid Peltier-induced migration of gallium molten zones which move through the substrate when gallium is used at the contact.

According to the present invention, these and other objects are achieved by making the electrical contact to the intermetallic compound of gallium via an intermediate layer of gallium in which has been dissolved more than 0.5% aluminum by weight.

The invention will now be described in more detail with reference to the accompanying drawing, which is a schematic cross-sectional side representation of apparatus in which the method of the present invention may be carried out.

Epitaxial layers of the type hereinafter described are generally grown in a controlled atmosphere, for example in hydrogen within a quartz tube, which is heated to a controllable ambient temperature in a furnace. In operation, the apparatus of the drawing would be in such a controlled heated atmosphere. Electric current to provide the Peltier effect is applied between stainless steel electrodes 10, 11 which are firmly embedded within graphite blocks 12, 13 respectively, and make good electrical contact therewith. A slider 14 having a pull rod 15 spaces the graphite blocks and electrically insulates them from each other. The slider 14 and end plates 16, 17 may be made from boron nitride for example. End plates 16, 17 function merely to support the blocks 12, 13 against relative movement. A solution 18 in a cavity within the upper block 12 is separated from a wafer 19 supported in a cavity within the lower block 13 by the slider 14. Slider 14 may be moved to the left to bring hole 20 into alignment with the cavities to bring the solution 18 into contact with the upper surface of the wafer 19. Wafer 19 rests on an intermediate layer 21, the composition of which will be discussed in more detail hereinafter, which intermediate layer rests on a graphite pedestal 22. It should be understood that the thickness of the intermediate layer 21 is very small in practice and has been artificially magnified here for the sake of clarity. An electrically insulating collar 23, which may also be constructed of boron nitride, supports the wafer and intermediate layer in the lateral direction and an inside shoulder on collar 23 also limits vertical movement of the wafer. Although the intermediate layer is a liquid in operation, as will become clear from the composition thereof and temperature of operation, it should be understood that the intermediate layer 21 is so thin that no lateral support against flow is needed. The collar 23 is used for positioning the wafer, for supporting the wafer against vertical movement and for insulating the sides of the wafer so that electrical contact from the intermediate layer is confined to the lower surface of the wafer and contact with the solution 18 upon movement of the slider is confined to the upper surface of the wafer. The graphite pedestal 22 must make good electrical contact with the graphite block 13. A threaded graphite plug 24 facilitates the making of good electrical contact with block 13 by exerting at least some pressure against the pedestal 22. A low resistance path is thereby created through plug 24 to block 13. Many other constructions are possible, however, which will also assure good electrical contact between the intermediate layer 21 and the block 13. In operation, wafer 19, intermediate layer 21 and graphite pedestal 22 are pressed together between the threaded graphite plug 24 and the inside shoulder of the collar 23. In order to effect epitaxial growth the apparatus is brought to an ambient temperature around the saturation temperature of the solution 18. Then the slider 14 is moved to the left and a current is caused to flow through the resulting liquid-solid interface by applying a voltage to electrodes 10, 11. Thermocouples (not shown) may be used to monitor the temperatures at desired points in the apparatus. A more detailed description of this general process is available to those not already familiar with Peltier-induced epitaxy in U.S. Pat. No. 3,879,235.

The present invention is specifically directed toward the intermediate layer 21 and the composition thereof when the wafer 19 is an "intermetallic III-V compound of gallium." This phrase is intended to include GaAs, GaP, GaAsP, $Ga_{1-x}Al_xAs$ ($0<x<1$), $Ga_{1-x}Al_xP$ ($0<x<1$), combinations thereof, and other intermetallic compounds which contain gallium and at least one group V element. It is also intended to include such compounds even when they are doped with elements that are not selected from Groups III or V, for example when doped with an element from Group IV like silicon.

It has been found that when the substrate (wafer 19) is composed of one of these materials, the intermediate layer may be advantageously composed of gallium in which aluminum has been dissolved to a concentration of more than 0.5% by weight. This layer is liquid at temperatures beyond about 30° C and therefore physically contacts evenly the lower surface of wafer 19 and the upper surface of the graphite pedestal 22, which surfaces must have cooperating surface configuration which is preferably flat as shown. It has been found that the addition of aluminum to the gallium, especially at concentrations of 1% or greater aluminum by weight, greatly improves the wetting thereof to the graphite.

Furthermore, the aluminum appears to improve the wetting of the intermediate layer against the substrate possibly because the aluminum reacts with and therefore removes contamination materials that interfere with wetting. It has been found, however, that the substrate surface contacting the intermediate layer must be clean. It is recommended that the substrate surface be etch cleaned before applying the intermediate layer.

The most important function of the aluminum, however, is to prevent the intermediate layer from forming individual liquid phase zones of gallium that travel through the substrate when a current is applied. For example, when pure gallium is used for the intermediate layer and a Peltier current passes through the layer to cause Peltier cooling at the growth interface, it also results in formation of migrating molten zones of gallium originating at the intermediate layer. In this phenomenon, the molten zone has a leading interface where Peltier heating dissolves the solid phase in the substrate and a trailing interface where Peltier cooling resolidifies the molten zone. A temperature gradient also exists within the molten zone which causes a migration of solute atoms, thereby permitting the process to continue without establishing an equilibrium between the compositions of the liquid and solid phases. As a result, zones of molten gallium quickly travel through a substrate of GaAs for example. It has been discovered, however, that only a small amount of aluminum dissolved in the gallium dramatically slows down the migration of solute atoms (arsenic in the case where the substrate is GaAs) or otherwise somehow prevents this phenomenon from happening, thereby allowing the gallium-aluminum alloy to be used as an intermediate layer to great advantage. It has further been found that this destructive phenomenon still may occur at an aluminum concentration of 0.50% aluminum by weight but does not apparently occur at 0.56% aluminum by weight, thereby effectively limiting the minimum aluminum concentration to slightly more than 0.5% by weight. No upper limit for the aluminum concentration could be found except of course the limit imposed by the solubility of aluminum in gallium.

An aluminum layer may be provided alongside a gallium or a gallium-aluminum layer in order to provide additional aluminum at higher temperatures where the solubility of aluminum in gallium is increased. No advantage could be found in so increasing the aluminum concentration above the concentration which may be normally dissolved in gallium at or adjacent the melt point of about 30° C. At this temperature slightly more than 1% by weight of aluminum may be dissolved in gallium. This is the preferred concentration because it is easy to saturate gallium with aluminum merely by dropping chunks of aluminum into liquid gallium until no more dissolves. The resulting gallium-aluminum alloy may be applied to the substrate in any convenient fashion in either liquid or solid form and obviously may also be used to provide better contact between more than one individual wafer (of different thicknesses and/or different compositions of intermetallic III-V compounds of gallium) and between wafers, pedestals or plugs of graphite. For example, it should be understood that this invention applies equally well where the pedestal 22 is also composed of an intermetallic III-V compound of gallium even when the composition is different from that of the wafer 19.

EXPERIMENT I

An Si-doped GaAs wafer of 0.015 inch thickness was cleaned in organic solvents and etched in $H_2O_2:NH_3OH:2H_2O$ for 1 minute. Then a layer of aluminum was evaporated onto the unpolished side of the wafer to a thickness of approximately 5000 angstroms. Gallium metal was heated to approximately 50° C and saturated with aluminum. This alloy was then applied to the aluminum layer and formed a thin liquid pool. A graphite wafer was then pressed against the pool and laterally moved about squeezing out excess Ga-Al alloy.

In operation at high temperatures the aluminum layer dissolved into the Ga-Al alloy layer thereby enriching the Ga-Al layer and forming a single layer of Al enriched Ga-Al. The contact resistance was measured at approximately 850° C and found to be less than 0.05 ohm over a 1.2 cm² area. Peltier-induced liquid phase epitaxy of gallium aluminum arsenide was successfully carried out on the other side of the wafer in apparatus similar to that shown in the drawing.

EXPERIMENT II

In this experiment the GaAs wafer was prepared as before except that the layer of aluminum was eliminated and the gallium layer was saturated with aluminum at 30° to 40° C. The contact resistance was again measured at about 850° C and found to be about 0.012Ω over an area of 1.2 cm². Peltier-induced liquid phase epitaxy of gallium aluminum arsenide was again successfully carried out on the other side of the wafer in apparatus similar to that shown in the drawing.

EXPERIMENT III

In this experiment the wafer was prepared as in Experiment II except that the aluminum concentration in the gallium was reduced to 0.5% by weight. After Peltier-induced epitaxy, holes were observed in the substrate where the intermediate layer had migrated through the substrate.

EXPERIMENT IV

In this experiment the wafer was again prepared as in Experiment II except that the aluminum concentration in the gallium was changed to 0.56% by weight. Peltier-induced epitaxy was then succesfully carried out and no holes were observed in the substrate.

EXPERIMENT V

In this experiment the substrate was an Si-doped GaP wafer of 0.014 inch thickness. The intermediate layer was gallium in which aluminum had been added for an Al concentration of about 1.1% by weight. At 900° C the contact resistance was roughly measured to be about 0.02Ω to 0.05Ω over an area of 1.2 cm². Peltier-induced liquid phase epitaxy was successfully carried out on the other side of the wafer in apparatus similar to that shown in the drawing and no holes were observed in the substrate.

EXPERIMENT VI

This experiment was the same as in Experiment V except that the 0.014 inch GaP wafer was resting on a GaAs wafer of 0.094 inch thickness which in turn was resting on a graphite wafer that was in turn resting on a graphite pedestal. Between the GaP wafer and the GaAs wafer was applied an intermediate layer of gallium in which aluminum had been added for an Al concentration of 1.28% by weight. An intermediate layer of the same composition Ga-Al was also applied between the GaAs wafer and the graphite wafer and between the graphite wafer and the graphite pedestal. In apparatus similar to that shown in the drawing Peltier-induced liquid phase epitaxy was successfully carried out on the GaP wafer. The total contact resistance was about the same as in Experiment V and no holes were observed in any of the wafers.

What is claimed is:

1. In a method wherein liquid phase epitaxial growth on a solid substrate is induced or altered by passing an electrical current through the liquid-solid interface, an improved method for making electrical contact to the substrate when the substrate is an intermetallic III-V compound of gallium, comprising the steps of pressing a substantially flat graphite surface with which electrical contact may be made toward a substantially flat clean surface of a substrate composed of an intermetallic III-V compound of gallium and interposing between said flat surfaces a liquid layer of gallium in which aluminum has been dissolved to a concentration of more than 0.5% by weight.

2. The improved method of claim 1 wherein the liquid layer of gallium is saturated with aluminum.

3. The improved method of claim 1 wherein the substrate is composed of GaAs.

4. The improved method of claim 3 wherein the substrate is doped.

5. The improved method of claim 1 wherein the substrate is composed of GaP.

6. The improved method of claim 1 wherein the substrate comprises two or more wafers in stacked configuration and interposed between said wafers in a liquid layer of gallium in which aluminum has been dissolved to a concentration of more than 0.5% by weight.

7. The improved method of claim 6 wherein the wafers have different compositions but are all intermetallic III-V compounds of gallium.

* * * * *